(12) United States Patent
Lee et al.

(10) Patent No.: US 7,227,803 B2
(45) Date of Patent: Jun. 5, 2007

(54) APPARATUS FOR REDUCING DATA CORRUPTION IN A NON-VOLATILE MEMORY

(75) Inventors: Michael K. T. Lee, San Jose, CA (US); Chanh Van Doan, San Jose, CA (US)

(73) Assignee: Brocade Communications Systems, Inc., San Jose, CA (US)

( * ) Notice: Subject to any disclaimer, the term of this patent is extended or adjusted under 35 U.S.C. 154(b) by 622 days.

(21) Appl. No.: 10/633,264

(22) Filed: Jul. 31, 2003

(65) Prior Publication Data

US 2005/0024968 A1 Feb. 3, 2005

(51) Int. Cl.
*G11C 7/00* (2006.01)
(52) U.S. Cl. .................. 365/228; 365/226
(58) Field of Classification Search .......... 365/228, 365/226
See application file for complete search history.

(56) References Cited

U.S. PATENT DOCUMENTS 5,850,113 A * 12/1998 Weimer et al. ............ 307/125
6,473,361 B1 * 10/2002 Chen et al. ................ 365/244
6,514,781 B2 * 2/2003 Chang et al. ............... 438/19

\* cited by examiner

*Primary Examiner*—Michael Tran
(74) *Attorney, Agent, or Firm*—Wong, Cabello, Lutsch, Rutherford & Brucculeri, LLP

(57) ABSTRACT

The loss of data and/or the corruption of data that may occur in flash memory when a reset signal is received during a memory write cycle is prevented by delaying reset signals sent to the flash memory for a time period sufficient for a write cycle to be completed. The loss of data and/or the corruption of data that may occur in flash memory when the power supply is interrupted during a write cycle is prevented by providing a DC-to-DC converter with one or more large capacitors in parallel with its input as the power supply to the flash memory. If the system power supply fails or is interrupted, the discharge of the capacitor(s) delays the voltage decay at the input of the DC-to-DC converter such that the output of the DC-to-DC converter remains within tolerance for a time sufficient for the flash memory to complete a write cycle.

13 Claims, 6 Drawing Sheets

APPARATUS FOR REDUCING DATA CORRUPTION IN A NON-VOLATILE MEMORY

BACKGROUND

1. Field of the Invention

This invention relates to logic circuits having non-volatile memory. More specifically, it relates to reset signals sent to memory controllers for NAND-type flash memory and power supplies for NAND-type flash memory.

2. Description of the Related Art

Flash is one type of non-volatile memory. EPROM (Erasable Programmable Read Only Memory) can be programmed and erased enabling them to be re-used. Erasure is accomplished using an UV (Ultra Violet) light source that shines through a quartz erasing window in the EPROM package.

There also are OTP (One Time Programmable) EPROMs, sometimes called OTPROMs (One Time Programmable Read Only Memory), that are identical to an erasable EPROM but lack an erasing window to reduce costs. To reduce their cost these EPROMs come in a windowless plastic carrier, which is cheaper than the costly ceramic package required for the erasing window. They can be programmed one time only.

An EEPROM (Electrically Erasable Programmable Read Only Memory) is similar to an EPROM but the erasure is accomplished using an electric field instead of an UV light source. This eliminates the need of a window. Usually, EEPROM refers to a device that requires a programmer or special voltage to program it.

A flash EPROM is similar to an EEPROM except that large blocks of flash EPROMs are erased all at once while a regular EEPROM can erase one byte at a time. However, with flash EPROMs, in-circuit writing and erasing is possible because no special voltages are required. To accomplish in-circuit operation, one can write special application software routines. Flash EPROMs are also called nonvolatile memory.

Flash memory is a type of EEPROM chip. It has a grid of columns and rows with a cell that has two transistors at each intersection. The two transistors are separated from each other by a thin oxide layer. One of the transistors is known as a floating gate, and the other one is the control gate. The floating gate's only link to the row, or wordline, is through the control gate. As long as this link is in place, the cell has a value of 1. To change the value to a 0 involves a process called Fowler-Nordheim tunneling.

Tunneling is used to alter the placement of electrons in the floating gate. An electrical charge, usually 10 to 13 volts, is applied to the floating gate. The charge comes from the column, or bitline, enters the floating gate, and drains to a ground.

This charge causes the floating-gate transistor to act like an electron gun. The excited electrons are pushed through and trapped on other side of the thin oxide layer, giving it a negative charge. These negatively charged electrons act as a barrier between the control gate and the floating gate. A device called a cell sensor monitors the level of the charge passing through the floating gate. If the flow through the gate is greater than 50 percent of the charge, it has a value of 1. When the charge passing through drops below the 50-percent threshold, the value changes to 0. A blank EEPROM has all of the gates fully open, giving each cell a value of 1.

A CompactFlash® card is a small, removable mass storage device. First introduced in 1994, CompactFlash (CF) cards weigh about a half an ounce and are the size of a matchbook. They provide complete PCMCIA-ATA functionality and compatibility. CF data storage cards are also available using magnetic disk technology (Microdrive). With the built-in controller, a wide variety of low cost flash technologies can be used. The built-in controller lowers costs further by reducing costs in the host device and allowing defective flash chip cells to be mapped out, thus increasing flash chip yields. Microdrives provide the lowest cost data storage solution for capacities of 340 MB and above.

The BIOS (Basic Input/Output System) chip of a personal computer is perhaps the most common form of flash memory. However, removable solid-state storage devices are becoming increasingly popular. SmartMedia and CompactFlash cards are both well-known, especially as "electronic film" for digital cameras. Other removable flash memory products include Sony's Memory Stick, PCMCIA memory cards, and memory cards for video game systems.

Two main technologies dominate the non-volatile flash memory market today: NOR and NAND. The NAND-based solution is ideal for high capacity data storage, while NOR is best used for code storage and execution, usually in small capacities. There are many differences between NAND and NOR flash. One of them is the interface. NOR flash is basically a random access memory device. It has enough address pins to map its entire media, allowing for easy access to each and every one of its bytes. NAND devices are interfaced serially via a rather complicated I/O interface, which may vary from one device to another or from vendor to vendor. The same eight pins convey control, address and data information. NAND is typically accessed in bursts of 512 bytes; i.e., 512 bytes can be read and written at a time (similar to hard drives). This makes NOR ideal for running code, while NAND is best used as a data storage device (hard drive/block device replacement).

A typical storage-type CompactFlash contains many NAND flash memory units and an interface controller. Because of the nature of the serial interface, the controller handles the data transfer via a serial interface so that it is transparent to the high level interface. (i.e. CompactFlash card interface). Data corruption or loss can occur inside the CompactFlash memory if the power to the memory card is disrupted or a reset signal is received during a write cycle because the built-in controller may not have completed the write cycle and acknowledged it as a valid data. The corruption may not be recovered correctly and cause the system to hang if the error recovery/correction (ECC) circuit inside the built-in controller mis-detects this situation. One possible way of preventing such data corruption is to employ a hard disk drive as an alternative to flash non-volatile memory. However, flash memory has a number of advantages over hard disk drives: flash memory is noiseless; it allows faster access; it is smaller in physical size; it is lighter; and, it has no moving parts. Accordingly, a solution which solves this problem while permitting flash memory to be used for non-volatile data storage in situations where power loss during a write cycle may be encountered is critically needed.

SUMMARY OF THE INVENTION

A loss of data and/or corruption of data may occur in flash memory when a reset signal is sent before a write cycle is completed. Such loss or corruption can be prevented by providing a delay in the reset signal sufficient for a write cycle to complete. A loss of data and/or corruption of data may also occur in flash memory when the power supply is interrupted during a write cycle. This loss or corruption can be prevented by providing a voltage booster DC-to-DC converter with one or more large capacitors in parallel with its input as the power supply to the flash memory. The purpose the voltage booster DC-to-DC converter is to eliminate the requirement of using large amount of capacitors due to exponential decay of voltage during power down. If the system power supply fails, the discharge of the capacitor(s) delays the voltage decay at the input of the DC-to-DC converter such that the output of the DC-to-DC converter remains within tolerance for a time sufficient for the flash memory to complete a write cycle.

DETAILED DESCRIPTION

Figure 1:
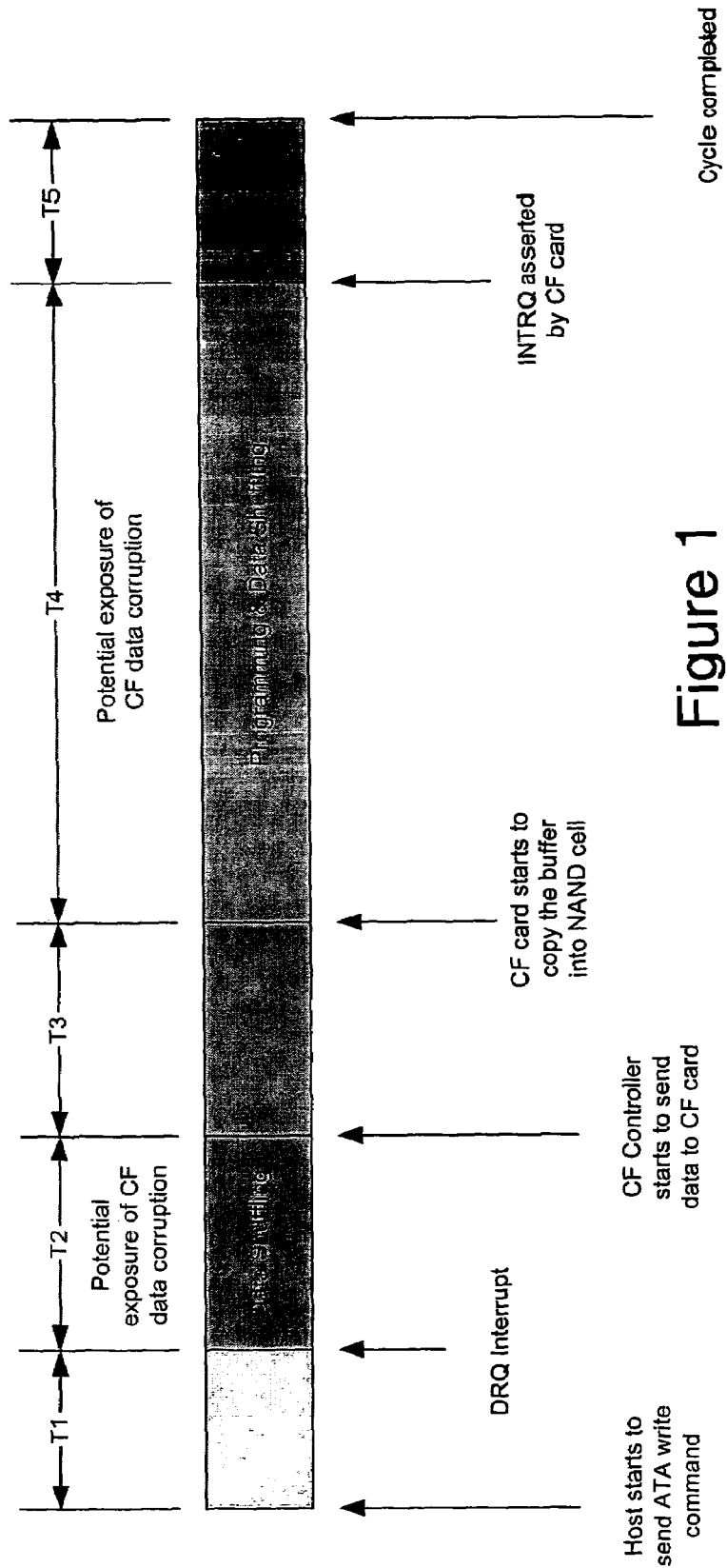
FIG. 1 is a timing diagram of a flash memory access cycle.

FIG. 1 illustrates one particular flash memory access cycle as a function of time. At the start of time segment T1 the CPU is sending an ATA write command; at the end of segment T1 the flash memory card asserts an interrupt to cause the DRQ bit to be set at the flash memory controller.

At the start of time segment T2, the DRQ bit is set at the flash memory controller; and, at the end of segment T2 the CPU responds to the interrupt.

At the start of time segment T3, the CPU writes data to the flash memory card buffer via the flash memory controller; at the end of segment T3, the flash memory card begins writing to the NAND flash memory device within the flash memory card.

At the start of time segment T4, the flash memory card has begun writing to the NAND flash memory device; at the end of segment T4, the flash memory card has completed the write and it asserts an interrupt to signal the completion of the write operation.

At the start of time segment T5, the flash memory card has asserted an interrupt to signal its completion of the write operation; at the end of segment T5 the CPU acknowledges the interrupt to complete the cycle.

It has been found that during time segments T2 and T4 there exists the potential for data corruption in the flash memory card if a power failure or power interruption occurs or a RESET signal is sent. The practice of the invention disclosed herein can reduce the potential for data corruption by providing a delay in power interruption to the flash memory card sufficient to bridge either time segment T2 and/or time segment T4.

As representative examples, it has been found that SanDisk flash memory part number SDCFB-XXX-101-50 has a T2 interval of about 30 msec and a T4 interval of about 300 μsec. SanDisk flash memory part number SDCFB-XXX-101-80 has a T2 interval of about 50 msec and a T4 interval of about 300 μsec. Toshiba flash memory part number THNCFxxxxBx has a T4 interval of about 50 msec.

In the case of SanDisk flash memory cards, the internal controller inside the flash memory card may shuffle the data if an ECC error is detected during read or write operations during time interval T2. The 30-msec duration of T2 represents the worst case scenario for flash memory card internal data shuffling during interval T2. Time interval T4 represents the worst case scenario single sector NAND flash memory programming time plus overhead.

In the case of Toshiba flash memory cards, the internal controller inside the flash memory card has not been found to shuffle the data during time interval T2. Interval T4 represents the worst case scenario to manage one page (32 blocks) of data for read or write operations.

Figure 2:
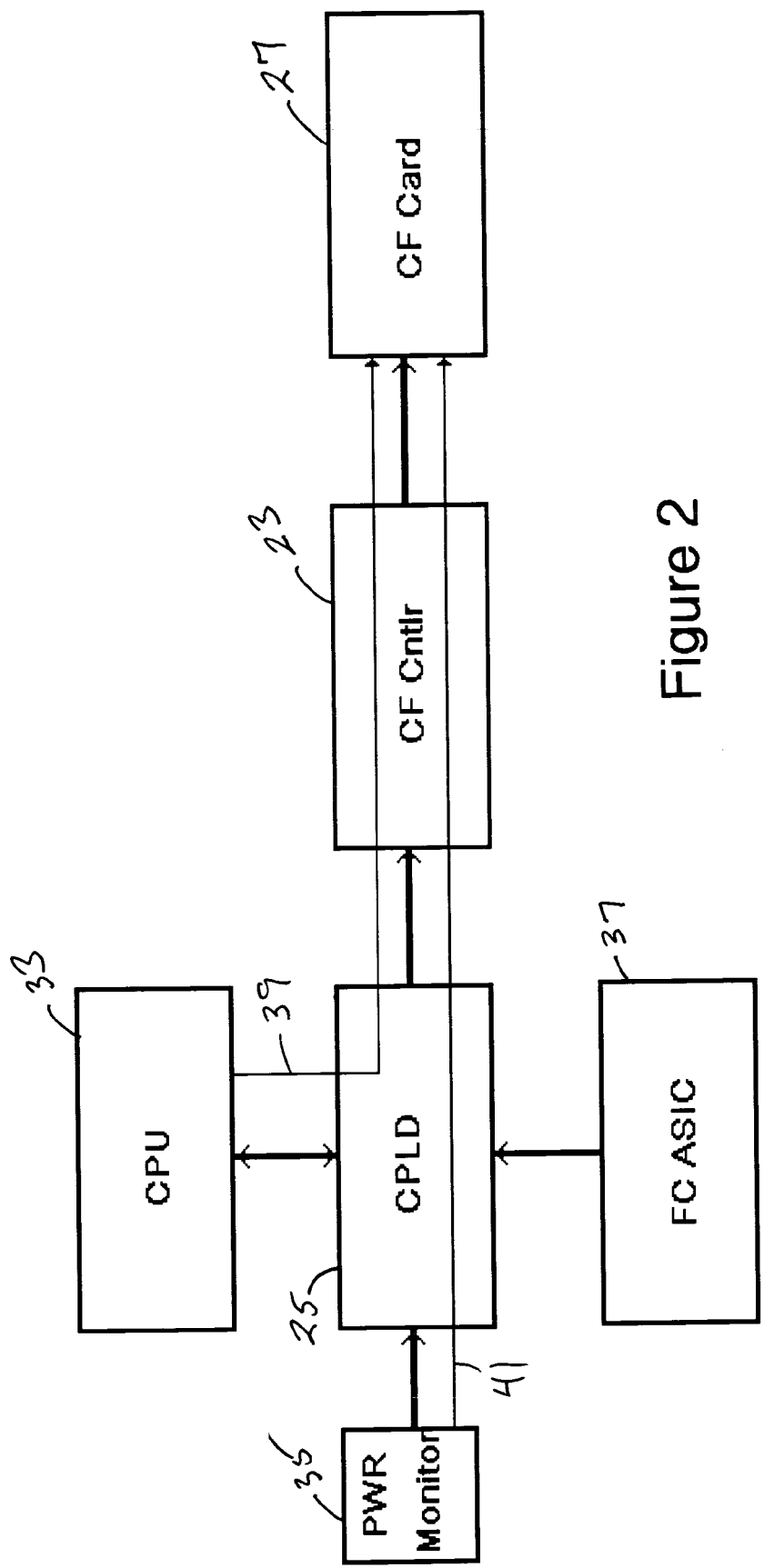
FIG. 2 is a block diagram of a flash memory card and its associated controller[s] in a configuration of the prior art showing two reset signal data paths.

FIG. 2 is a block diagram depiction of a typical flash memory implementation of the prior art. The particular implementation illustrated in FIG. 2 is a CompactFlash memory card 27 in a Fibre Channel switch having Application-Specific Integrated Circuit (ASIC) 37 in communication with Complex Programmable Logic Device (CPLD) 25 which is also in communication with Central Processing Unit (CPU) 33, power monitor 35 and flash memory controller 23.

Data path 39 shows conceptually how a reset signal from CPU 33 may be sent to flash memory 27. Any CPLD reset due, for example, to a CPU watchdog error or a soft reset generated by the software controlling CPU 33 will drive the CF card reset signal immediately. Similarly, data path 41 shows conceptually how a reset signal from power monitor 35 may drive a reset signal to flash memory 27.

Figure 3:
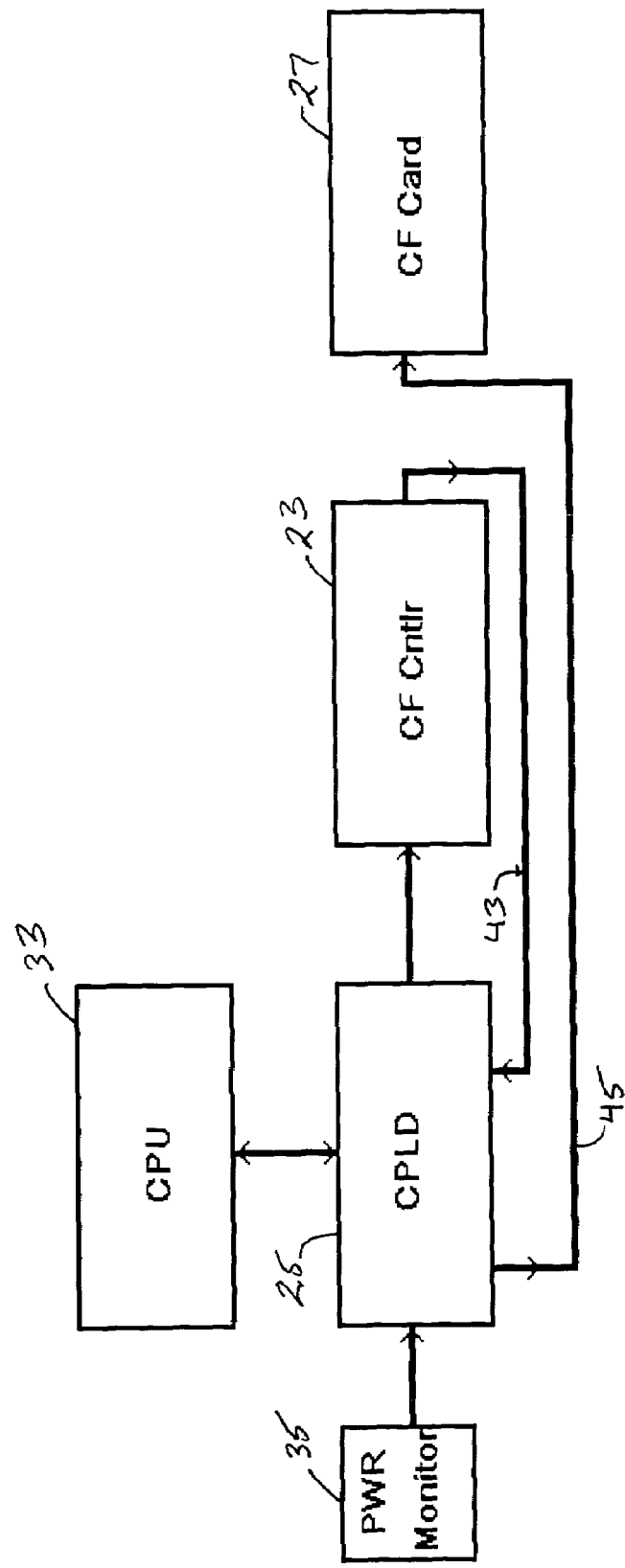
FIG. 3 is a block diagram of a flash memory card and its associated controller[s] in a configuration according to the present invention.

It has been found that if a reset signal is sent to a flash memory during a flash memory write cycle, data loss and/or data corruption may occur. FIG. 3 illustrates a solution to this problem according to one embodiment of the present invention. Rather than communicating a reset signal directly to flash memory card 27, flash memory controller 23 makes use of logic gates in CPLD 25 to provide a delay in the reset signal sufficient for a memory write cycle to complete in flash memory 27. Thus, reset signals may be routed via data connection 43 to CPLD 25 which delays transmission of the reset signal to flash memory 27 before sending the reset signal via data connection 45. In this way, completion of a flash memory write cycle can be assured even if a reset signal is asserted during the write cycle. The duration of the delay may be selected to exceed by about 50 percent the time required for the particular flash memory employed to perform a write cycle. For typical flash memories, a delay of about 100 msec has been found to be sufficient.

Figure 4:
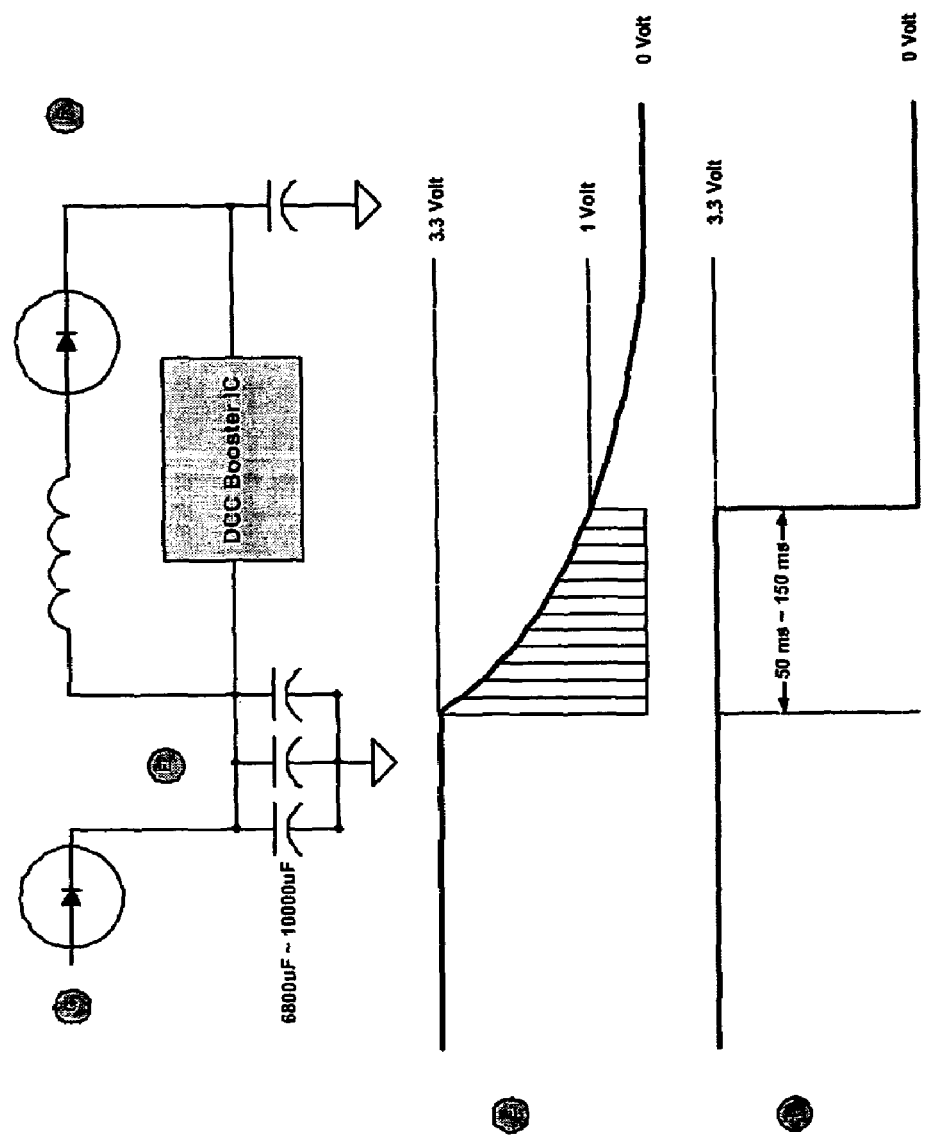
FIG. 4 is a schematic diagram of a DC voltage booster circuit in accordance with one embodiment of the invention.

Referring now to FIG. 4, there is depicted in schematic diagram form, a DC voltage booster circuit in accordance with one embodiment of the invention.

In greatly simplified form, a non-isolated DC-to-DC converter takes a direct current input (i.e., a constant voltage), chops it into an AC (alternating current) waveform using a solid-state switch, changes the voltage of this AC waveform, as required, using an inductor, rectifies, filters and regulates the resulting AC waveform to produce a DC output at a different voltage from the input DC voltage.

Typically, a DC-to-DC converter can accept a range of input voltages while still producing its rated output voltage. Thus, if the input voltage decays over time, the output voltage will remain constant at the rated value until the input voltage drops below the minimum value of the input voltage needed to produce the nominal output voltage. This situation is in contrast to an abrupt (on/off or square wave) interruption of the input (supply) voltage.

One way of ensuring a usable time delay in a decaying input voltage is to place one or more capacitors between the input point of the DC-to-DC converter and ground. A capacitor is a charge storing device. The DC-to-DC converter has an input impedance and appears to the system power supply as a resistive load.

When a constant voltage is suddenly applied to a series combination of a resistor R and capacitor C, the current through the resistor decays exponentially with time. The voltage across the resistor is proportional to the current (Ohm's Law), and the voltage across the resistor as a function of time can be written as:

$$V_R = V_o e^{-t/RC}$$

The product T=RC is referred to as the time constant. Physically, if you start at any point in the waveform, then after a time T the signal will have decreased to 1/e (or about 37%) of the original value. The product RC (the resistance in ohms times the capacitance in farads) has the dimensions of time and is called the capacitive time constant of the circuit. It is equal to the time at which the charge on the capacitor has increased to within a factor of $1-e^{-1}$ (approximately 63%) of its equilibrium value.

Upon application of the input voltage, the charge of the capacitor builds up and the charging current decreases until the capacitor is fully charged.

During discharge, $V_c$ (the voltage across the capacitor)= $(1/C)q = \epsilon e^{-t/RC}$ where q is the charge on the capacitor and $\epsilon$ is the electromotive force (emf).

It can be shown that the voltage across the capacitor will reach ½ its equilibrium value in 1.22 time constants (RC). Thus, the time to reach this value can be increased by increasing the value of C. The total capacitance of capacitors electrically connected in parallel is the sum of the individual capacitances of each capacitor. Accordingly, in addition to choosing large capacitors, one may place a number of capacitors in parallel in order to achieve the desired time constant.

Stated another way, the voltage $V_c$ decrease during discharge is delayed in a way measured by the time constant RC. For more delay, C can be increased (assuming R, the resistive load, remains constant).

In operation, a DC voltage which in certain embodiments may be 3.3 vdc is applied at point G while the load, typically a flash memory card, is connected at point F. In normal operation, both diode 1 and diode 2 are forward biased and current flows from point G to point F through inductor 9 and capacitors 3, 5 and 7 charge to the potential of point G. In this condition, DC-to-DC converter 15 has essentially the same potential at both its input and output and therefore may not be operational.

It will be appreciated by those skilled in the art that the capacitors positioned in the circuit between ground and point E, such as those shown as elements 3, 5 and 7 in FIG. 1a, are preferably of large capacitance and a number of such capacitors may be connected in parallel to achieve the desired time constant of the circuit.

Also shown in FIG. 4 is the behavior of the circuit as voltage-versus-time plots at points E and F, respectively. If the main power supply fails, the voltage at point G drops and the charge on capacitors 3, 5 and 7 reverse biases diode 1 thereby preventing current flow from point E back to the failed power supply at G. For some period of time (which may, in some embodiments, be between about 50 to about 150 milliseconds), the charge on capacitors 3, 5 and 7 will be sufficient to maintain the voltage at point E within the voltage input parameters of DC-to-DC converter 15. In the particular example illustrated, if the voltage at point E (the input to DC-to-DC converter 15) is between about 3.3 vdc and 1.0 vdc, the output of DC-to-DC converter 15 at point F will be maintained at the rated value of 3.3 vdc.

The voltage decay at point E following a failure of the main power supply at point G is illustrated as a voltage-versus-time curve in FIG. 4. For purposes of illustration, the decay portion is shown is time segments beginning with $1^{st}$ segment 17 and ending with $12^{th}$ segment 19. At the end of $12^{th}$ segment 19 the voltage at point E has decayed to below the operational input range of DC-to-DC converter 15 (e.g., 1.0 vdc) and, as shown at the corresponding point in FIG. 4, the voltage at point F goes to zero.

During the operational period of DC-to-DC converter 15, diode 11 is reversed biased thereby preventing current flow from the load (point F) to point E.

Inductor 9 serves to limit the current from point E to point F around the DC-to-DC converter during first time segment 17 giving the DC-to-DC converter 15 time to begin regulating the voltage at point F and reverse biasing diode 11.

Capacitor 13 at output of DC-to-DC converter 15 may be provided to provided additional filtering of the output voltage.

During operation, the bank of capacitors between point E and ground (capacitors 3, 5 and 7 in the circuit illustrated in FIG. 1a) are in series with DC-to-DC converter 15 which presents a load between point E and ground. Thus, this is an RC circuit with a time constant R*C where C is the capacitance at point E (in the circuit illustrated in FIG. 4, the sum of the individual capacitances of capacitors 3, 5 and 7) and R is the input impedance of DC-to-DC converter 15. Assuming that the input impedance of DC-to-DC converter 15 is a fixed value, the time constant R*C of the circuit may be selected to provide the desired useful time interval 21 (as shown in the voltage-versus-time plot at point F in FIG. 4) by adjusting the total capacitance between point E and ground. Such selection may be accomplished by adding or removing capacitors in parallel and/or selecting capacitors of suitable capacitance. It has been found that a capacitance of between about 6800 µF and about 10,000 µF at point E is sufficient to provide a working time interval 21 between about 50 and about 150 milliseconds when is employed as DC-to-DC converter 15.

In one embodiment, the flash memory card's power source is at point F, where the 3.3 vdc supply is extended for about 50 msec to 150 msec longer than at point E (where the voltage can be as low as 1 vdc) due to the energy stored in the large capacitors at point E and the DC voltage booster circuit. Therefore the booster circuit provides continued operation during time T2 and T4 when the flash memory card is vulnerable to data corruption or loss.

Figure 5:
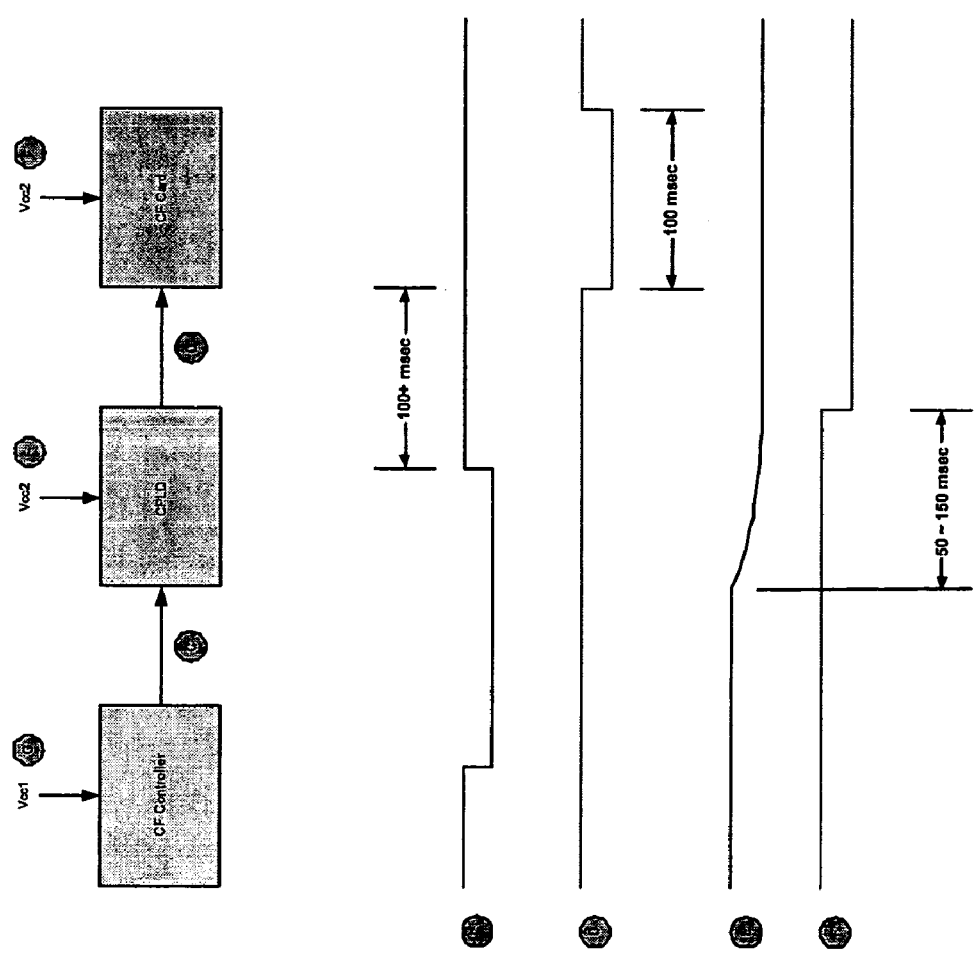
FIG. 5 is a block diagram of a flash memory card with its associated controller[s] and power supplies showing associated voltage and signal waveforms at selected points during reset and power cycling operations.

FIG. 5 illustrates in block diagram form, a flash memory card 27 and its associated interface in the form of a Complex Programmable Logic Device (CPLD) 25 and flash memory controller 23.

Flash memory controller 23 receives power from Vcc1 while CPLD 25 and the flash memory card 27 are powered by Vcc2. Points C, D, F and G correspond to those illustrated in FIG. 4. Waveforms C and D illustrate the flash memory card RESET control scheme as voltage-versus-time plots of the signal. Waveforms E and F similarly illustrate the flash memory card power cycling control scheme.

Waveform C in FIG. 5 illustrates a scenario in which a RESET is signaled by CF Controller 23 (positive-going edge of a negative pulse on line C). CPLD 25 identifies the signal as a RESET signal and starts a timer which, in turn, signals the expiration of interval 29. As illustrated in Waveform D in FIG. 5, CPLD 25 then assets a negative pulse of duration 31 on the reset line of CF Card 27. In this way, any write cycle being executed by CF Card 27 has sufficient time to complete even if a RESET is signaled during the write cycle.

Waveform E in FIG. 5 illustrates a failure of the power supply to CF Card 27. This voltage-versus-time curve is a plot of the voltage at Point E in the circuit of FIG. 4 during a power failure or power interruption. The voltage at Point E decays during time interval 21 in a manner determined by the time constant of the RC circuit comprised of capacitors 3, 5 and 7 and DCC Booster IC 15 (see FIG. 4). As illustrated in Waveform F of FIG. 5, the booster circuit of the present invention maintains the operational voltage at point F until the end of interval 21, thereby allowing CF Card 27 sufficient time to complete a write cycle which may have begun prior to the power supply failure or interruption.

Figure 6:
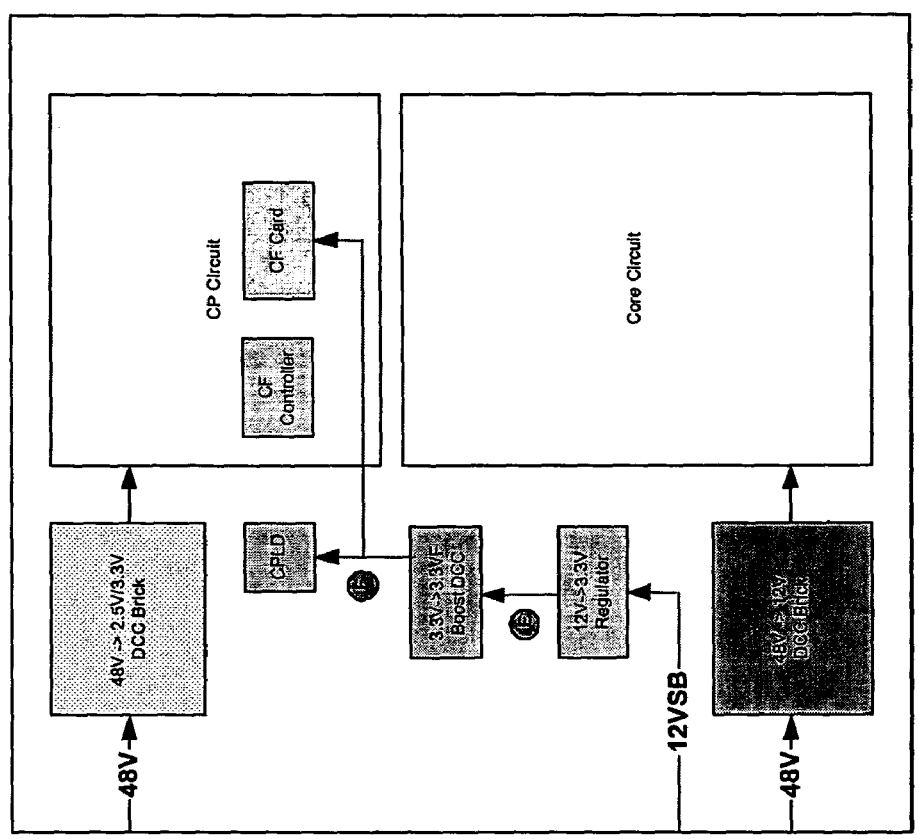
FIG. 6 is a block diagram of one particular flash memory power source in accordance with the present invention.

FIG. 6 illustrates in block diagram form one particular application of the present invention in a Fibre Channel switch equipped with a flash memory card non-volatile memory. The power source for the CPLD interface and flash memory card is derived from the 12 vdc standby supply which is independent of the control processor (CP) and core logic power sources (which are derived from a 48 vdc supply). At point F, the power source is always on as long as the CP 128 blade is installed, regardless of the status of the CP or Core power supplies.

In the particular embodiment illustrated, the charge storage device is a capacitor or a bank of capacitors. Other charge storage devices may also be employed in the practice of the invention—e.g., batteries, etc.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A circuit for delaying power interruption to a non-volatile memory device comprising:
   a power supply having an output connected to the non-volatile memory device;
   a charge-storing device connected to the output of the power supply; and,
   a DC-to-DC converter connected at its input to the charge-storing device and the power supply and connected at its output to the non-volatile memory device such that upon interruption of the power supply, the charge-storing device provides sufficient input voltage to the DC-to-DC converter to provide rated output to the non-volatile memory device for a time sufficient for the non-volatile memory device to complete a write cycle.

2. A circuit as recited in claim 1 wherein the charge-storing device is a capacitor.

3. A circuit as recited in claim 1 wherein the charge-storing device is an electrolytic capacitor.

4. A circuit as recited in claim 1 wherein the charge-storing device is a super capacitor.

5. A circuit as recited in claim 1 wherein the charge-storing device comprises a plurality of capacitors connected in parallel.

6. A circuit as recited in claim 1 further comprising an inductor connected in parallel with the DC-to-DC converter.

7. A circuit as recited in claim 6 further comprising a diode connected in series between the inductor and the output of the DC-to-DC converter.

8. A circuit as recited in claim 1 further comprising a diode at the input of the charge storing device connected such that the flow of electric current from the charge-storing device to the power supply is prevented.

9. A circuit as recited in claim 1 wherein the non-volatile memory device is a NAND-type flash memory.

10. A method of supplying power to a non-volatile memory device comprising:
    providing regulated power from a power supply;
    storing electrical charge from the power supply in a charge-storing device;
    transferring the stored electrical charge upon interruption of the power supply to the input of a DC-to-DC converter at a potential sufficient to operate the DC-to-DC converter; and
    supplying regulated DC power from the output of the DC-to-DC converter to the non-volatile memory device for a time sufficient for the non-volatile memory device to complete a full write cycle.

11. A method of preventing data corruption in a non-volatile memory device comprising:
    determining whether a control signal sent to the non-volatile memory device is a reset signal;
    delaying the control signal if the control signal is a reset signal for time sufficient for the non-volatile memory device to complete a memory write cycle;
    providing regulated power from a power supply to the non-volatile memory device;
    storing electrical charge from the power supply in a charge-storing device;
    transferring the stored electrical charge upon interruption of the power supply to the input of a DC-to-DC converter at a potential sufficient to operate the DC-to-DC converter; and
    supplying regulated DC power from the output of the DC-to-DC convener to the non-volatile memory device for a time sufficient for the non-volatile memory device to complete a write cycle.

12. A method as recited in claim 11 wherein the non-volatile memory device is a flash memory.

13. A method as recited in claim 12 wherein the flash memory is a NAND-type flash memory.

* * * * *